 (12) United States Patent
Chen et al.

(10) Patent No.: US 8,836,121 B2
(45) Date of Patent: Sep. 16, 2014

(54) CIRCUIT BOARD WITH TWINNED CU CIRCUIT LAYER AND METHOD FOR MANUFACTURING THE SAME

(71) Applicant: National Chiao Tung University, Hsinchu (TW)

(72) Inventors: Chih Chen, Hsinchu (TW); Hsiang-Yao Hsiao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 14/055,456

(22) Filed: Oct. 16, 2013

(65) Prior Publication Data

US 2014/0103501 A1    Apr. 17, 2014

(30) Foreign Application Priority Data

Oct. 16, 2012   (TW) .............................. 101138044 A (51) Int. Cl.
  *H01L 23/48*     (2006.01)
  *H01L 21/768*    (2006.01)
  *H01L 23/532*    (2006.01)

(52) U.S. Cl.
  CPC .... *H01L 21/76873* (2013.01); *H01L 23/53238* (2013.01)
  USPC ............................ 257/750; 257/758; 438/637

(58) Field of Classification Search
  USPC ........... 257/666, 750, 758; 428/397; 438/637; 75/371, 741
  See application file for complete search history.

(56) References Cited

U.S. PATENT DOCUMENTS

| | | | |
|---|---|---|---|
| 6,515,368 B1 | 2/2003 | Lopatin et al. | |
| 6,525,425 B1 | 2/2003 | Woo et al. | |
| 6,670,639 B1 * | 12/2003 | Okabayashi et al. | 257/64 |
| 8,551,211 B2 * | 10/2013 | Oilmann et al. | 75/371 |

OTHER PUBLICATIONS

Changsup Ryu, Alvin L.S. Loke, Takeshi Nogami and S. Simon Wong, Effect of texture on the electromigration of CVD copper, IEEE International Reliability Physics Symposium, 1997, pp. 201-205.

* cited by examiner

*Primary Examiner* — Roy Potter
(74) *Attorney, Agent, or Firm* — Muncy, Geissler, Olds & Lowe, P.C.

(57) ABSTRACT

A circuit board with twinned Cu circuit layer and a method for manufacturing the same are disclosed, wherein the method comprises the following steps: (A) providing a substrate with a first circuit layer formed thereon, wherein the first circuit layer comprises a conductive pad; (B) forming a first dielectric layer on the surface of the substrate; (C) forming plural openings in the first dielectric layer, wherein each opening penetrates through the first dielectric layer and communicates with the conductive pad to expose the conductive pad; (D) forming a Cu seeding layer in the openings; (E) forming a nano-twinned Cu layer in the openings with an electroplating process; and (F) annealing the substrate to transfer the material of the Cu seeding layer into nano-twinned Cu, wherein the nano-twinned Cu layer and the transferred Cu seeding layer are formed into a second circuit layer.

20 Claims, 6 Drawing Sheets
(1 of 6 Drawing Sheet(s) Filed in Color)

CIRCUIT BOARD WITH TWINNED CU CIRCUIT LAYER AND METHOD FOR MANUFACTURING THE SAME

CROSS-REFERENCE TO RELATED APPLICATIONS

The present application claims the benefit of Taiwanese Patent Application No. 101138044, filed on Oct. 16, 2012, which is incorporated by reference in its entirety.

BACKGROUND OF THE INVENTION

The present invention relates to a circuit board with twinned copper circuit layer and method for manufacturing the same, particularly to a circuit board with twinned copper circuit layer for using on integrated circuit and method for manufacturing the same.

With the rapid development of the electronics industry, demand for minimum volume, light weight; multifunction, and high-performing electronics has seen steady increased in quantity. On the current integrated circuit development, the semiconductor packaging technologies are applied now, in order to pack a number of active elements and passive elements onto the same device; therefore, an object having more circuits and electronic components are accommodated within a finite unit area can be achieved.

In the past of integrated circuit and packaging industries, chemical vapor deposition (CVD), plasma-enhanced chemical vapor deposition (PECVD), sputtering, chemical plating or electroplating and so on are used more to form copper line conductors (or known as copper wires). However, the copper lines prepared as above described method usually have the issue of under-performing capability to resist electromigration. Particularly, the electromigration resistance capability and mechanical property of the electrical wire and nanoscale electrical wire can have significant impact on the reliability of the products in the integrated circuit of the semiconductor devices.

For this reason, technologies involving addition of other metals or materials into copper wires have been developed. However, this method has the potential problem of suffering from contamination, or increasing cost of manufacture, the value of actual application in reality is instead less noticeable.

In addition, in the current semiconductor copper manufacturing process, physical vapor deposition can operate to deposit into metal copper having a nano twinned structure for forming a copper circuit, so as to replace current copper wires, and therefore raising copper wire's electromigration resistance capability. However, the nanoscale twinned copper formed by the physical vapor deposition has short crystal lattice having scattered orientation led to by undefinable copper lattice direction. As such, the twins' density is relatively low, and therefore cannot work to lead to significant improvement on electromigration resistance capability and ultimately failing to create actual utility value. In addition, when physical vapor deposition is used to form twinned copper structure, the time for deposition is a lengthy undertaking, and cannot work to plate into vias or trenches having high aspect ratio, this method therefore cannot be directly applied in copper interconnect, copper wires, or through-silicon via (TSV).

Because the twinned copper has excellent electromigration resistance, if a method for manufacturing twinned copper having excellent crystal lattice may be developed, so as to it will be possible to replace the current copper wire and the method for manufacturing the same, and therefore enhancing the electromigration resistance of the copper wire.

SUMMARY OF THE INVENTION

One main object of the present invention is to provide a circuit board having twinned copper circuit layer, so as to enhance electromigration resistance capability of copper wire, and increasing product reliability.

Another object of the present invention is to provide a method for manufacturing circuit board having twinned copper circuit layer, so as to produce copper circuit layer having twinned copper.

In order to achieve the abovementioned object, a method for preparing a circuit board with twinned Cu circuit layer, comprising the following steps of: (A) providing a substrate with a first circuit layer formed thereon, wherein the first circuit layer comprises a conductive pad; (B) forming a first dielectric layer on the surface of the substrate; (C) forming plural openings in the first dielectric layer, wherein each opening penetrates through the first dielectric layer and correspond to the conductive pad to expose the conductive pad; (D) forming a Cu seeding layer in the openings; (E) forming a nano-twinned Cu layer in the openings with an electroplating process; and (F) annealing the substrate to transfer the material of the Cu seeding layer into nano-twinned Cu, wherein the nano-twinned Cu layer and the transferred Cu seeding layer are formed into a second circuit layer, and the second circuit layer comprise plural first conductive vias formed in the openings.

Through the above manufacturing process, the present invention provides a circuit board with twinned Cu circuit layer, comprising: a substrate, which comprises at least a first circuit layer, and the first circuit layer comprises a conductive pad; a first dielectric layer, which is formed on a surface of the substrate, wherein the first dielectric layer comprises a plurality of openings to exposing the conductive pad; and a second circuit layer, which is formed on the surface of the first dielectric layer, the second circuit layer comprises a plurality of first conductive vias, each of the first conductive vias is disposed in the opening so as to be electrically connected to the conductive pad, and the second circuit layer is made from nano-twinned Cu layer. Furthermore, the first circuit layer is preferred to be made from a nano twinned.

The method for manufacturing the circuit board having twinned copper circuit layer of the present invention is by means of electroplating and annealing to form nano twinned copper having preferred orientation and high twinned crystal density. In particular, the electroplated nano twinned copper would grow toward the seed crystal layer having no twinned crystals by means of the annealing process, and the original seed crystal layer can be transformed wholly or partially into nano twinned copper, therefore the circuit layer formed therefrom would turn to be made by nano twinned copper, and the seed crystal layer may wholly transformed into the nano twinned copper or partially remained in the opening Preferably, the seed crystal layer is wholly transformed into the twinned copper. As such, in the circuit board having nano twinned copper circuit layer of the present invention, the second circuit layer is made by nano twinned copper having preferred orientation and high twin crystal density. Because the surface diffusion rate in the preferred orientation of the nano twinned copper is slower, the copper wire's electromigration resistance capability can be greatly reduced, and the reliability of the product can be enhanced. Accordingly, when compared against the copper wire formed by the traditional physical vapor deposition, the twin crystal's density of the current invention is higher and has better electromigration resistance, and it has shorter manufacturing time, making it more suitable in the technical application in integrated circuit industry.

In the method for manufacturing circuit board having the twinned copper circuit layer of the current invention, step (C) is: forming plural openings in the first dielectric layer, wherein each opening penetrates through the first dielectric layer and correspond to the conductive pad to expose the conductive pad; step (D) is: forming a Cu seeding layer in the openings; step (E) is: forming a nano-twinned Cu layer in the openings with an electroplating process; and step (F) is: annealing the substrate to transfer the material of the Cu seeding layer wholly or partially into nano-twinned Cu, wherein the nano-twinned Cu layer and the transferred Cu seeding layer are formed into a second circuit layer, and the second circuit layer comprise plural first conductive vias formed in the openings.

In addition, in the method for manufacturing circuit board having the twinned copper circuit layer of the current invention, the method further comprises a step (G) after step (F): forming a circuit built-up structure on a surface, wherein the circuit built-up structure comprises at least a second dielectric layer, at least a third circuit layer, and a plurality of second conductive vias, and a portion of the second conductive vias are electrically connected with the second circuit layer. In this case, the third circuit layer is preferred to be made by the same method for forming the abovementioned second circuit layer, Through the above manufacturing process, the circuit board having twinned copper circuit layer of the current invention further comprise a built-up circuit layer structure, which is disposed on a surface of the first dielectric layer and the second circuit layer, in which the built-up circuit layer structure comprises at least a second dielectric layer, at least a third circuit layer, and a plurality of second conductive vias, and a portion of the second conductive vias are electrically connected with the second circuit layer. Here, the third circuit layer is preferably made by a nano twinned copper.

In another aspect of the present invention, over a 50% percentage of a volume of the nano-twinned Cu layer comprises a plurality of dies, and these dies are preferred to be columnar twinned grains. In addition, the plurality of dies are interconnected with each other, and each die is formed as a result of the stacking of plural nano twinned copper along the [111] crystal axis direction, and an angle included between adjacent crystal dies is 0° to 20° in a stacking direction.

In another aspect of the present invention, the method for forming nano twinned copper layer can be direct current electroplating or pulse electroplating. Preferably, the method for forming nano twinned copper layer can be of the following: providing an electroplating device, the electroplating device comprises an anode, a cathode, an electroplating solution, and an electrical power supply source; wherein the electrical power supply source is connected respectively to the anode and the cathode, and the anode and the cathode are immersed in the electroplating solution; and using the electrical power supply source to provide electrical power to perform electroplating, wherein nano twinned copper layer grows on a surface of the cathode. Herein, the electroplating solution comprises: a copper-containing salinized matter, an acid, and chlorine ion source.

In the above electroplating solution, the main function of the chlorine ion is to fine tune the growth direction of dies, to make twinned metal have preferred orientation for crystallization. In addition, the acid can be a organic acid or an inorganic acid, so as to increase concentration of the electrolyte and to increase electroplating speed, for example, sulfuric acid, methyl sulfonic acid, or a combination thereof can be used; in addition, concentration of acid in the electroplating solution is preferred to be 80-120 g/L. Furthermore, the electroplating solution needs to have a copper ion source at the same time (that is, salinized matter of copper , for example, sulfuric acid copper or methyl sulfonic acid copper). In a preferred composition of the electroplating solution, the solution can further comprise an additive, which can be selected from a group consisting of: gelatin, surfactant, lattice modification agent, and a combination thereof, for use in adjusting the growth direction of the grains that can be fine-tuned by the additive.

Here, the electrical power supply of the electroplating device is preferred to be a direct current electroplating supply source, or a high-speed pulse electroplating supply source, or either one of the two, so as to increase the formation rate of twined metal layer. When the direct current electroplating supply source is used in step (B), the electric current density is preferred to be 1-12 ASD, which is more preferred to be 2-10 ASD (e.g. 8 ASD). When the high-speed pulse electroplating supply source is used in step (B), the operating condition is preferred to be: $T_{on}/T_{off}$ (sec) being between 0.1/2-0.1/0.5 (e.g. 0.1/2, 0.1/1, or 0.1/0.5), electric current density being 1-25 ASD (more preferred 5 ASD). Performing electroplating under these conditions, nano twinned copper growth rate is calculated by actual running time, which is preferred to be 0.22-2.64 μm/min. For example, when the electric density for electroplating is 8 ASD, the growth rate of the twinned metal can be 1.5-2 μm/min (for example, 1.76 μm/min): In the present invention, thickness of nano twinned copper layer varies in accordance with the electroplating time, its range being preferred between 0.1-500 μm, more preferred to be 0.8-200 μm, most preferred to be 1-20 μm. Twinned copper metal layer having preferred orientation as manufactured by conventional technologies does not have via-filling ability, thickness from mass production can only reach about 0.1 μm, which is therefore only usable as a seed crystal layer, and not ideal for applications such as wires. However the thickness of the electroplated nano twinned copper layer of the current invention can be between 0.1-500 μm, and can be plated directly on the opening of dielectric layer or trenches, and therefore be applied in the circuit layer manufacture of the circuit board of the current invention.

In addition, when electroplating is performing, the cathode or the electroplating solution can rotate at a rotational speed of 50-1500 rpm, to aiding twinned crystal growth orientation and speed rate. By appropriate conditions for electroplating, diameter of the die of the nano twinned copper layer obtained by the current invention is preferred to be 0.1-50 μm, more preferred to be 1-10 μm ; thickness of the grain can be preferred to be 0.01-500 μm, more preferred to be 0.1-200 μm.

In the method for manufacturing the circuit board having the twinned copper circuit layer of the current invention, conditions for annealing can be the process conditions commonly seen in the current technical field, provided that the material of the copper grain layer can be switched to nano twinned copper. For example, annealing under 200-500° C. can run for 15-120 minutes, more preferably at 250-450° C. for 40-100 minutes, and more preferably at 270-350° C. for 50-70 minutes.

Furthermore, in another aspect of the present invention, the material of the substrate and its structure are not particularly limited, which can be silicon substrate, glass substrate, quartz substrate, metal substrate, plastic substrate, print circuit board, copper foil substrate, III-V group material substrate, insulator board, or circuit board having multilayer circuits. In addition, packaging substrate having circuit layer, three dimensional integrated circuit (3D-IC) board, semiconductive chip can also be used as the substrate for the present invention.

The time required for the method for manufacturing the current invention is shorter than the physical vapor deposition method required for the known technology, and the deposition rate and speed rate are faster. The expensive vapor phase deposition equipment is not required, therefore, this can greatly reduce the production cost. In addition, the present invention can also produce in a simple manner nano twinned copper having high density and [111] preferred orientation, which has, in addition to excellent mechanical properties (higher elastic modulus), higher electromigration resistance capability as increased by twinned crystals arrangement, which all can contribute to increasing product liability and especially applicability to manufacture of integrated circuit.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. Other various aspects also may be practiced or applied in the invention, and various modifications and variations can be made without departing from the spirit of the invention based on various concepts and applications.

Embodiment 1

FIGS. 1A to 1D are cross-sectional views of a process for manufacturing the copper circuit layer of the present embodiment. FIG. 2 is a schematic view of an electroplating device for forming copper circuit layer of the present embodiment.

Figure 1A:
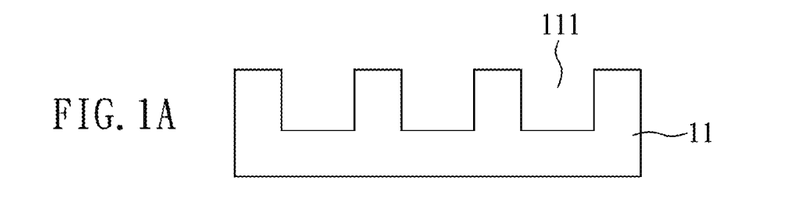
FIGS. 1A to 1E are cross-sectional views of a process for manufacturing copper circuit according to embodiment 1 of the current invention.
Figure 2:
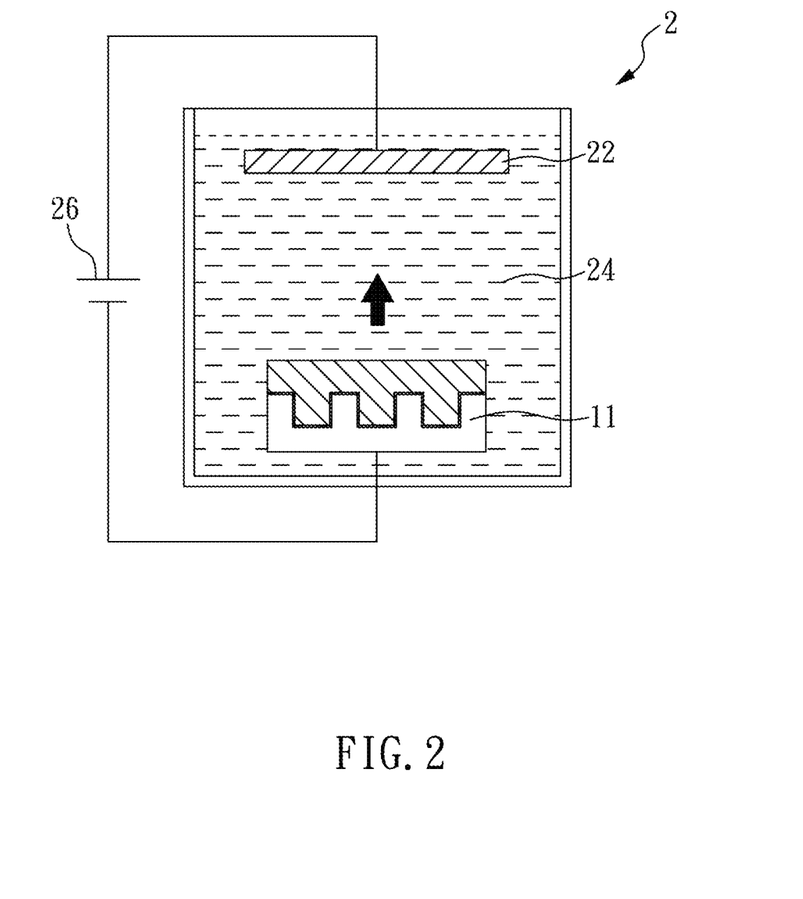
FIG. 2 shows a schematic view of an electroplating device for forming copper circuit layer according to embodiment 1 of the current invention.

As shown in FIG. 1A, the first step of the method is to provide a silicon substrate 11, on which a surface is disposed with multiple trenches 111, and the height and depth of the each trenches is 0.8 μm and 0.8 μm respectively. The next step is to use the electroplating device shown in FIG. 2 to carry out electroplating on the silicon substrate 11. As shown in FIG. 2, the silicon substrate is placed in an electroplating device 2 as a cathode; wherein, the electroplating device 2 comprises an anode 22, which is immersed in an electroplating solution 24 and connected to a direct current electrical power 26 (Keithley 2400 is used in this case). The materials used for anode 22 can be metal copper, phosphor bronze or insert anode (e.g. titanium plated platinum); in the current embodiment, the anode 22 is made by metal copper. In addition, the electroplating solution comprises copper sulfate (copper ion concentration ranging between 20-60 g/L), chlorine ion (concentration of which ranging between 10-100 ppm), and methyl sulfonate (concentration of which ranging between 80-120 g/L), and additional surfactants or lattice dressers (e.g. BASF Lugalvan 1-100 ml/L). Optionally, the electroplating solution 24 of the current embodiment can further comprise organic acid (e.g. methyl sulfonate), gelatin, or a mixture of the above, for use in dressing lattice structure and size.

Figure 1B:
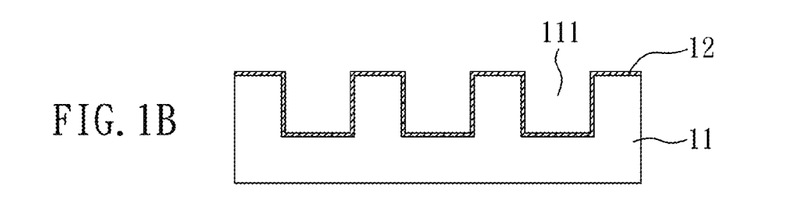
Figure 1C:
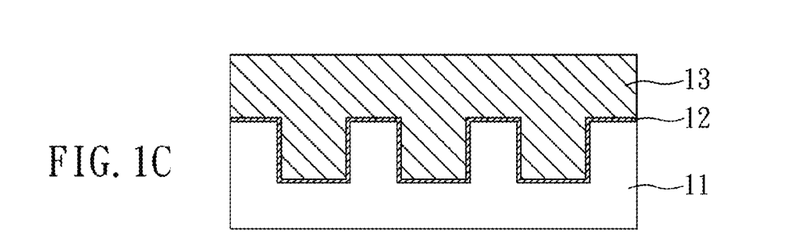
Figure 1D:
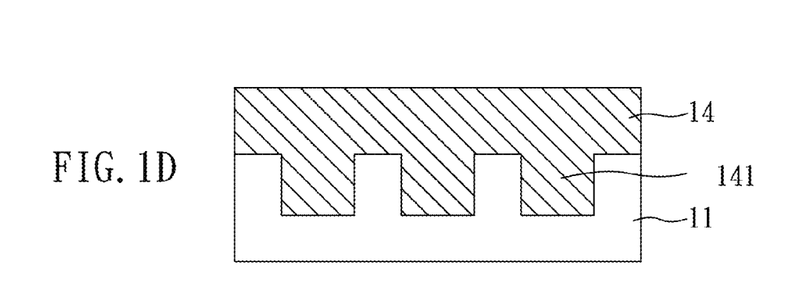

Next, physical vapor deposition is used to apply pulsed electric current to stabilize electric current, in order to deposit a copper seed crystal layer 12 on the silicon substrate 11 and the trench 111, as shown in FIG. 1B. Here, the copper seed crystal layer 12 has a thickness of about 0.05 μm. After the silicon substrate 12 is formed, a direct current with a current density of 2-10 ASD is used to perform electroplating, wherein, as shown in FIG C, the silicon substrate 11 starts to grow nano twinned copper layer 13 in the direction pointed by an arrow shown in FIG. 2. In the growing process, the (111) surface of twinned crystals and planar surface of the nano twinned copper layer 13 are perpendicular to the direction of the electric field, and twinned copper is grown at a rate of 1.76 μm/min; in more specific terms, nano twinned copper layer 13 grows along perpendicular to the (111) direction, namely the nano twinned copper layer is the parallel electric field direction.

The nano twinned copper layer 13 is grown completely, comprising a plurality of twinned copper dies, each twinned copper die is composed of numerous twinned crystal copper, the nano twinned copper die can extend to the surface, therefore a surface of the nano twinned copper layer 13 would the same as a (111) surface. Thickness of the nano twinned copper layer 13 that has been electroplated is about 2 μm, and the [111] crystal axis is normal to the (111) surface.

The final step is to remove the silicon substrate 11 from the electroplating device, after 30 minutes of 400° C. annealing process, the twinned copper of the nano twinned copper layer 13 would turn to grow toward the copper seed crystal layer having no twinned crystals, to therefore transform the nano twinned copper seed crystal layer 12 into nano twinned copper. With the annealing process finished, nano twinned copper layer 13 and the original copper seed crystal layer 12 (as shown in FIG. 1C) would transform to form a circuit layer 14, and the circuit layer 14 comprises a circuit 141.

In particular, after the electroplating and annealing process of the present embodiment, circuit layer 14 would no longer have seed crystal layer having twinned crystal, and would become entirely a circuit layer having nano twinned copper structure. Accordingly, the circuit layer 14 is composed of numerous nano twinned copper crystals, the nano twinned copper crystal would reach the surface, therefore a surface of the circuit layer 14 would the same as a (111) surface.

Figure 1E:
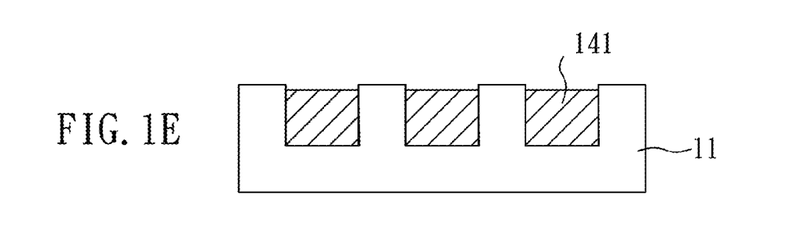

If necessary, a chemical mechanical polish (CMP) step is applied to the circuit layer 14 to reduce the thickness of the circuit layer 14 to form the silicon substrate 11 having the nano twinned copper crystal circuit 141 as shown in FIG. 1E.

In addition, an analysis of focused ion beam (FIB) shows that over 50% volume of the nano twinned copper 43 of the circuit layer 14 comprises numerous columnar grains, and each grain has plural layer-shaped nano twinned copper. Furthermore, diameter of each columnar grain ranges between about 0.5 μm and 8 μm and its height ranges between 2 μm and 20 μm, and nano twinned planar surface 661 (level striation) is disposed parallel to (111) surface, a grain boundary 662 is between twinned crystals, (111) planar surface of copper is perpendicular to the e thickness T's direction, and a thickness T of the twinned copper layer 43 is about 20 μm (freely adjustable between 0.1 μm-500 μm). An angle included between the stacking directions (approximately equivalent to [111] crystal axis) formed between adjacent crystal grains is between 0 and 20 degrees.

Figure 3A:
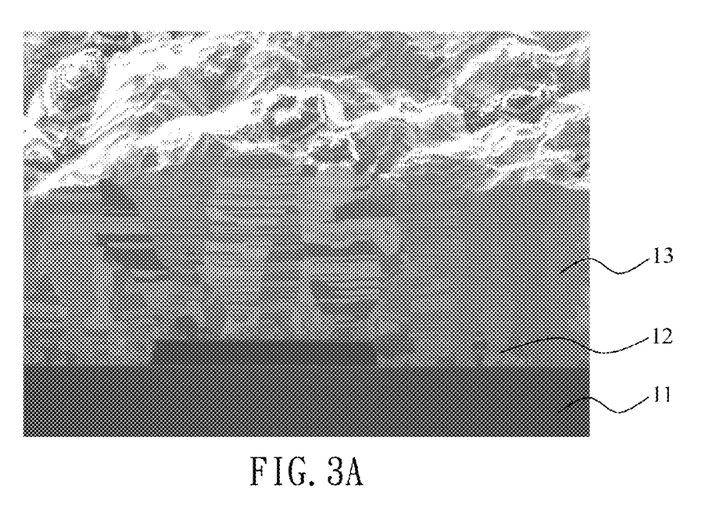
FIG. 3A is an ion scanning image of the copper circuit layer that is not treated by an annealing process, according to embodiment 1 of the present invention.
Figure 3B:
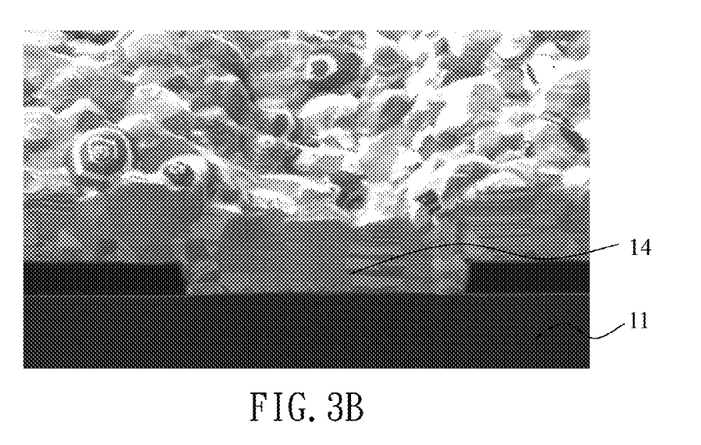
FIG. 3B is an ion scanning image of the copper circuit layer that is treated by an annealing process, according to embodiment 1 of the present invention.

FIGS. 3A and 3B are respectively ion scanning images of the copper circuit layer of the current invention, wherein the former is one that has not undergone the annealing process and the latter having gone through the annealing process. As shown in FIG. 3A, orderly arranged copper seed crystal layer and nano twinned copper layer 13 can be clearly seen on the silicon substrate 11 before the annealing process; in FIG. 3B, after the annealing process is finished, the entire circuit layer 14 is uniformly composed of nano twinned copper, indicating that original copper seed crystal layer has been transformed into nano twinned copper.

Embodiment 2

FIGS. 4A to 4E are cross-sectional views of the process for preparing circuit board of the present embodiment.

Figure 4A:
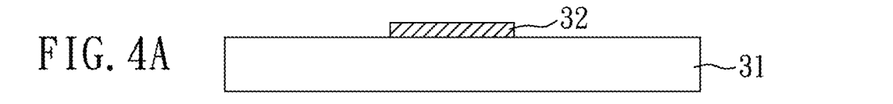
FIGS. 4A to 4E are cross-sectional views of a process for preparing the circuit board of embodiment 2 according to the present invention.

FIG. 4A begins with first providing a substrate 31, for which at least a surface is disposed with a first circuit layer, the first circuit layer is used as an electric attachment pad 32. This pad may connect to the active devices in the substrate. In the current embodiment, the substrate 31 is a circuit board having multiple layers of circuit; which will be shown here in drawings only, without description of detailed structure. In addition, the electric attachment pad 32 of the first circuit layer is manufactured by the same method for making circuit layer for embodiment 1, and the pad has nano twinned copper structure.

Figure 4B:
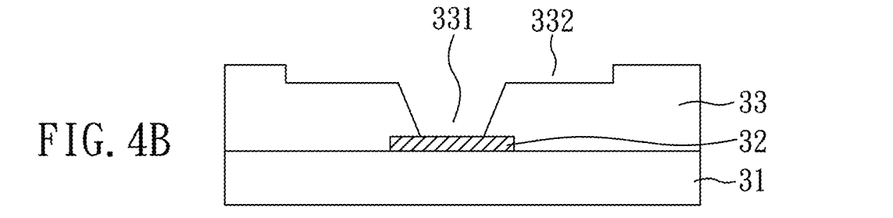

And then as shown in FIG. 4B, the next step is to form a first dielectric layer 33 on at least one surface of the substrate 31. Then, by way of the manufacturing process commonly used in the present invention technical field, such as photolithography, form openings 331 and trenches 332 on the first dielectric layer 33, wherein the opening 331 operates to pass through the first dielectric layer 33 and correspond to the conductive pad 32 to expose the conductive pad 32.

Figure 4C:
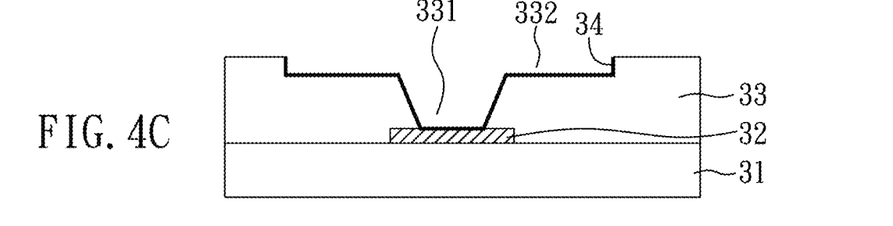
Figure 4D:
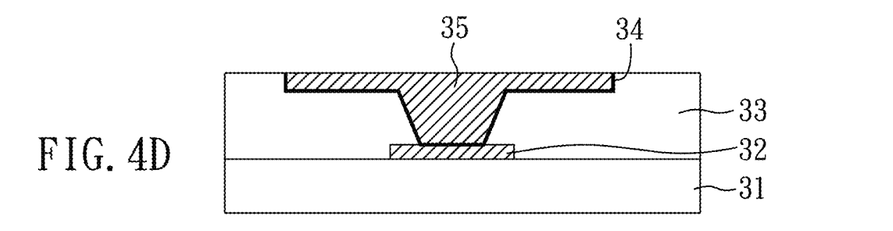

Afterwards, as shown in FIG. 4C, using the same manufacturing method and conditions for making the copper seed crystal layer described in Embodiment 1, form a cooper seed crystal layer 34 in the opening 331 and the trench 332; then using the same manufacturing method and conditions for making the nano twinned copper layer described in Embodiment 1, deposit a nano twinned copper layer 35 in the openings 331 and trenches 332 by an electroplating method, as shown in FIG. 4D.

Figure 4E:
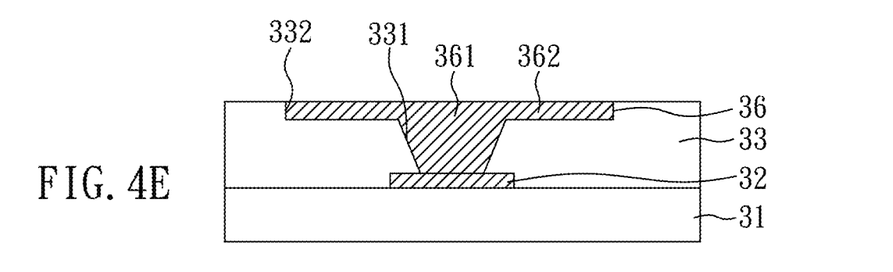

The last step, as shown in FIGS. 4D and 4E, is to perform an annealing process on the substrate 31, using the same annealing process and conditions as described in Embodiment 1, to transform copper seed crystal layer 34 into nano twinned copper. After the annealing process, the nano twinned copper layer 35 and the transformed copper seed crystal layer 34 work to form a second circuit layer 35, and the second circuit layer 36 comprises a first conductive via 361 formed at the opening 331, and a first circuit 362 formed at the trench 332, as shown in FIG. 4E.

The circuit board of the present embodiment, prepared by the abovementioned manufacturing process, as shown in FIG. 4E, comprises: a substrate 31, the surface of which is disposed with a first circuit layer, and the first circuit layer comprises an electrical attachment layer 32; a first dielectric layer 33, which is disposed on a surface of the substrate 31 and the first circuit layer, wherein the first dielectric layer 33 comprises multiple openings for exposing electrical attachment pad 32; and a second circuit layer 36, which is formed on a surface of the first dielectric layer 33, the second circuit layer 36 comprises multiple first conductive vias 361, the first conductive via 361 is set up to communicate with the electrically connected electrical attachment pad 32 at the opening 331, and the second circuit layer 36 is made by nano twinned copper. Furthermore, the first dielectric layer 33 further comprises trenches 332, the second circuit layer 36 further comprises a first circuit 362, and the first circuit 362 is disposed in the trench 32.

In particularly the material making up the second circuit layer 36 is the same as the nano twinned copper of Embodiment 1, which is composed of multiple nano twinned copper grains, wherein the nano twinned copper grain reaches the surface, therefore making the surface of the second circuit layer 36 is the same as (111) surface.

Embodiment 3

Figure 5A:
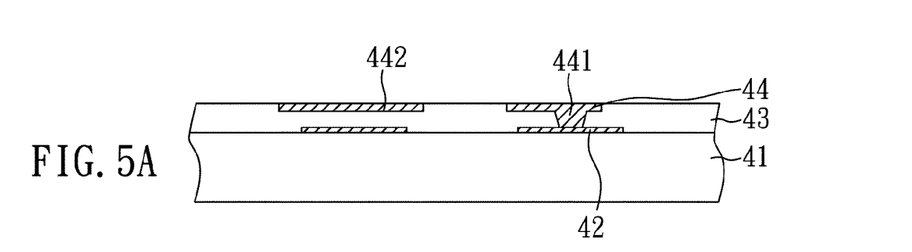
FIGS. 5A to 5B are cross-sectional views of a process for preparing the circuit board of embodiment 3 according to the present invention
Figure 5B:
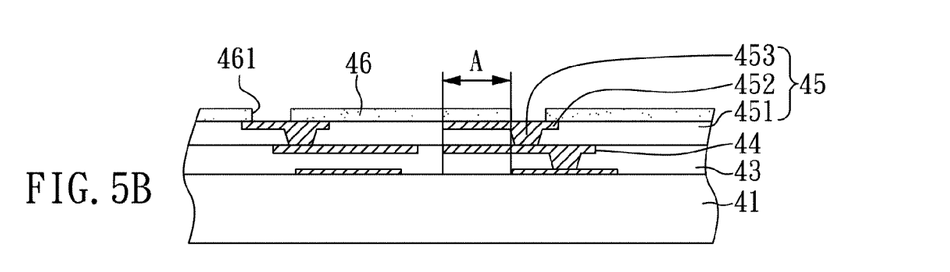

FIG. 5A to 5B are cross-sectional views of a process for preparing the circuit board of embodiment 3 according to the present invention.

As shown in FIG. 5A, the circuit board of the present invention comprises: a substrate 41, the surface of which has a first circuit layer, and the first circuit layer comprises an electrical attachment pad 42; a first dielectric layer 43, which is disposed on a surface of the substrate 41 and the first circuit layer; and a second circuit layer 44, which is formed on a surface of the first dielectric layer 43, the second circuit layer 44 comprises multiple first conductive vias 441 and a first circuit 442, the first conductive via 441 communicates and is electrically connected to the electrical attachment pad 42. Here, the manufacturing method and conditions for the substrate, first dielectric layer 43 and second circuit layer 44 are the same as for Embodiment 2, further elaboration will be omitted here.

Furthermore, a built-up circuit layer structure 45 can be formed on a surface of the first dielectric layer 43 and the second circuit layer 44 through a built-up circuit layer structure manufacturing process; wherein the built-up circuit structure 45 comprises a second dielectric layer 451, a third circuit layer 452, and a second conductive via 453, and the second conductive via 453 is electrically connected to the second circuit layer 44. Here, the manufacturing method and conditions for the second dielectric layer 451, third circuit layer 452 and second conductive via 453 of the built-up circuit layer are the same as those for the first dielectric layer, second circuit layer and first conductive via of Embodiment 2, as such, further description will not be provided.

Moreover, a solder mask 46 can be formed additionally on the third circuit layer 452 of the outermost layer of the circuit board of the present embodiment; wherein the opening 461 is disposed on the solder mask, so as to expose a portion of the third circuit layer 452 in order to save as an conductive pad for follow-on or other semiconductive equipments, as shown in FIG. 5B.

In the present embodiment, the first circuit layer and its conductive pad 42, the second circuit layer 44 and the first conductive via 441, and third circuit layer 452 and its second conductive via 452 are made by nano twinned copper, and are composed by multiple nano twinned copper grains.

Figure 6:
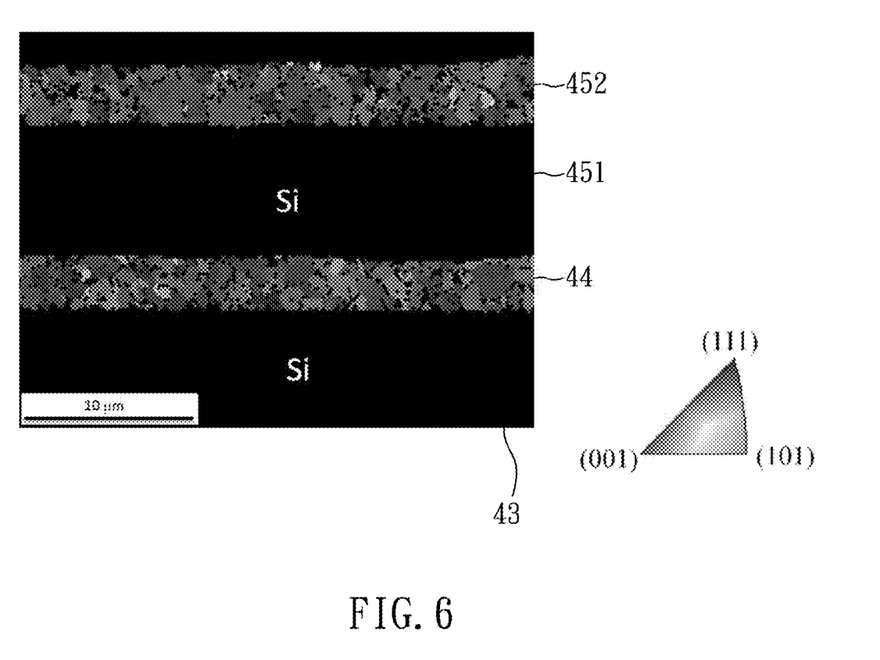
FIG. 6 is an electron backscatter diffraction photo of the section "A" of FIG. 5B according to embodiment 3 of the present invention.

According to FIG. 6, an analysis of electron backscatter diffraction (EBSD) of section "A" in FIG. 5B shows that the stretched second circuit layer and the stretched third circuit layer 452 are presented in two parallel nano twinned copper lines, wherein both of them have the crystals growing along the (111) direction. Therefore, not only via but also circuit lines on the circuit board of the present invention are made of (111) nano twinned copper.

Since the nano twinned copper has excellent mechanical property, higher elastic modulus, preferred electromigration resistance capability, the circuit board and its method for manufacturing the present invention are particularly applicable for use in the back-end-of-line (BEOL) for integrated circuit; to produce interconnect inside copper having excellent electromigration resistance, and therefore enhance product liability.

The above embodiments are for the purpose of better description and are of exemplary nature only, the scope of right asserted by the current invention is based on the scope of claims in this application, and are not intended to be restricted by the above embodiments.

What is claimed is:

1. A circuit board with twinned Cu circuit layer, comprising:
    a substrate, which comprises at least a first circuit layer, and the first circuit layer comprises a conductive pad;
    a first dielectric layer, which is formed on a surface of the substrate, wherein the first dielectric layer comprises a plurality of openings adapted for exposing the conductive pad; and
    a second circuit layer, which is formed on the surface of the first dielectric layer, the second circuit layer comprises a plurality of first conductive vias, each of the first conductive vias is disposed in the opening so as to be electrically connected to the conductive pad, and the second circuit layer is made from nano-twinned Cu layer.

2. The circuit board according to claim 1, wherein the first dielectric layer further comprises a plurality of trenches, the second circuit layer further comprises a first circuit, and the first circuit is disposed in the trenches.

3. The circuit board according to claim 1, wherein over 50% percentage of a volume of the nano-twinned Cu layer comprises the plurality of dies.

4. The circuit board according to claim 3, wherein the plurality of dies is each a columnar twinned transistor.

5. The circuit board according to claim 3, wherein the plurality of dies is each connected to each other, and the each die is formed by stacking of a plurality of nano twinned Cu in a [111] crystal direction, and an included angle between stacking direction of adjacent dies is from 0° to 20°.

6. The circuit board according to claim 1, further comprising a circuit built-up structure disposed on a surface between the first dielectric layer and the second circuit layer, wherein the circuit built-up structure comprises at least a second dielectric layer, at least a third circuit layer, and a plurality of second conductive vias, and a portion of the second conductive vias are electrically connected with the second circuit layer.

7. The circuit board according to claim 6, wherein the third circuit layer is made by nano twined Cu.

8. The circuit board according to claim 7, wherein over 50% of volume of the third circuit layer comprises a plurality of dies.

9. The circuit board according to claim 8, wherein each of the plurality of dies is a columnar twinned die.

10. The circuit board according to claim 8, wherein the plurality of dies is connected with each other, each die is formed by stacking of a plurality of nano twinned Cu in a [111] crystal direction, and an included angle between stacking direction of adjacent dies is from 0° to 20°.

11. A method for preparing a circuit board with twinned Cu circuit layer, comprising the following steps:
    (A) providing a substrate with a first circuit layer formed thereon, wherein the first circuit layer comprises a conductive pad;
    (B) forming a first dielectric layer on the surface of the substrate;
    (C) forming plural openings in the first dielectric layer, wherein each opening penetrates through the first dielectric layer and communicates with the conductive pad so as to expose the conductive pad;
    (D) forming a Cu seeding layer in the openings;
    (E) forming a nano-twinned Cu layer in the openings with an electroplating process; and
    (F) annealing the substrate to transfer the material of the Cu seeding layer into nano-twinned Cu, wherein the nano-twinned Cu layer and the transferred Cu seeding layer are formed into a second circuit layer, and the second circuit layer comprise plural first conductive vias formed in the openings.

12. The method according to claim 11, wherein step (C) is: forming plural openings in the first dielectric layer, wherein each opening penetrates through the first dielectric layer and communicates with the conductive pad so as to expose the conductive pad; step (D) is: forming a Cu seeding layer in the openings; step (E) is: forming a nano-twinned Cu layer in the openings with an electroplating process; and step (F) is annealing the substrate to transfer the material of the Cu seeding layer into nano-twinned Cu, wherein the nano-twinned Cu layer and the transferred Cu seeding layer are formed into a second circuit layer, and the second circuit layer comprise plural first conductive vias formed in the openings.

13. The method according to claim 11, wherein over a 50% percentage of a volume of the nano-twinned Cu layer comprises the plurality of dies.

14. The method according to claim 13, wherein the plurality of dies is each a columnar twinned transistor.

15. The method according to claim 13, wherein the plurality of dies is each connected to each other, and the each die is formed by stacking of a plurality of nano twinned Cu in a [111] crystal direction, and an included angle between stacking direction of adjacent dies is from 0° to 20°.

16. The method according to claim 13, further comprising a step (F) after the step (G): forming a circuit built-up structure on a surface, wherein the circuit built-up structure comprises at least a second dielectric layer, at least a third circuit layer, and a plurality of second conductive vias, and a portion of the second conductive vias are electrically connected with the second circuit layer.

17. The method according to claim 16, the third circuit layer is made by nano twined Cu.

18. The method according to claim 17, wherein over 50% of volume of the third circuit layer comprises a plurality of dies.

19. The method according to claim 18, wherein each of the plurality of dies is a columnar twinned die.

20. The method according to claim 18, wherein the plurality of dies is connected with each other, each die is formed by stacking of a plurality of nano twinned Cu along a [111] crystal direction, and an included angle between stacking direction of adjacent dies is from 0° to 20°.

* * * * *